US005623217A

United States Patent [19]
Britton et al.

[11] Patent Number: 5,623,217
[45] Date of Patent: Apr. 22, 1997

[54] FIELD PROGRAMMABLE GATE ARRAY WITH WRITE-PORT ENABLED MEMORY

[75] Inventors: Barry K. Britton, Schnecksville; Kai-Kit Ngai, Allentown; Satwant Singh, Macungie, all of Pa.

[73] Assignee: Lucent Technologies Inc., Murray Hill, N.J.

[21] Appl. No.: 606,702

[22] Filed: Feb. 26, 1996

[51] Int. Cl.⁶ .................................................. H03K 19/177
[52] U.S. Cl. ......................................... 326/40; 326/93
[58] Field of Search ................ 365/189.08; 326/38–41, 326/46, 93

[56] References Cited

U.S. PATENT DOCUMENTS

| | | | |
|---|---|---|---|
| 5,343,406 | 8/1994 | Freeman et al. | 364/490 |
| 5,384,497 | 1/1995 | Britton et al. | 326/44 |
| 5,386,156 | 1/1995 | Britton et al. | 326/37 |
| 5,432,719 | 7/1995 | Freeman et al. | 364/579 |
| 5,488,316 | 1/1996 | Freeman et al. | 326/41 X |
| 5,550,782 | 8/1996 | Cliff et al. | 326/40 X |
| 5,559,450 | 9/1996 | Ngai et al. | 326/40 |
| 5,566,123 | 10/1996 | Freidin et al. | 365/189.08 X |

*Primary Examiner*—David R. Hudspeth
*Attorney, Agent, or Firm*—James H. Fox

[57] ABSTRACT

A field programmable gate array includes programmable function units (PFUs) that may function as either a logic block or a random access memory (RAM). Each PFU has a write-port enable input when the PFUs are being used as user RAM units. In addition, each PFU includes a write-strobe input. The write operation is accomplished when both the write-port enable input and the write-strobe input are active. This technique allows a reduction of logic gates and control signal conductors. In many cases, these advantages allow for higher system operating frequencies and more gate capacity at a lower cost.

11 Claims, 2 Drawing Sheets

5,623,217

FIELD PROGRAMMABLE GATE ARRAY WITH WRITE-PORT ENABLED MEMORY

BACKGROUND OF THE INVENTION

1. Field of the Invention

The present invention relates to a field programmable gate array having a memory that uses a write-port enable signal.

2. Description of the Prior Art

An integrated circuit field programmable gate array (FPGA) comprises an array of programmable logic cells (PLCs). Each PLC includes a programmable logic block, which is referred to herein as a programmable function unit (PFU), but may also be referred to as a programmable logic unit (PLU) or by various other names known in the art. The logic cells also include conductors, conventionally referred to as "routing resources", for routing signals within, and between, the various PLCs of the FPGA. The routing resources are also typically programmable to some extent, in order to provide additional flexibility for implementing the desired functionality by the user of the FPGA. See, for example, U.S. Pat. No. 5,384,497 co-assigned herewith for routing resource techniques known in the art.

The PFU includes various programmable logic elements that may be programmed by the user to provide a wide variety of possible logic functions by a single integrated circuit (IC). The logic elements are typically implemented in part by the use of a programmable look-up table (LUT) that comprises an array of memory cells. One implementation of the use of look-up tables in logic elements is shown in U.S. Pat. No. 5,386,156 co-assigned herewith. It is also known to use the memory cells in the LUT as user-accessible random access memory (RAM), which may be accessed by various other logic cells in the FPGA. This provides the flexibility of using a given PLC to perform either logic or memory functions, as may be programmed by the user of the FPGA. The RAM control signals include a write-strobe signal which is activated when data is to be written into the RAM. In addition, a read-port enable signal is activated when data is to be read out of the RAM. In a typical memory implementation, only one write location and only one read location (which may be the same as the write location) of the RAM may be accessed at any given time. One implementation of such a programmable dual-use for memory cells is given in U.S. Pat. No. 5,343,406, for example.

Referring to FIG. 1, an illustrative random access memory (RAM) that comprises the memory cells in four programmable function units 101 (PFU1), 102 (PFU2), 103 (PFU3) and 104 (PFU4) is shown. Each PFU comprises 64 memory cells, with various other numbers of memory cells and PFUs in a given RAM being possible. Each PFU in the RAM includes a write-strobe signal input (lines 105, 106, 107 and 108) that allows data to be written into the PFU from input lines 132. A read-port enable signal, also known as the output tri-state signal "T", is supplied to each tri-state output buffer(109, 110, 111 and 112) on signal lines 113, 114, 115 and 116. When activated, a given read-port enable signal allows the associated tri-state output buffer to place data read from the associated PFU onto the associated conductor of the DATA OUT bus (117). Note that the read-port enable signals from 2-to-4 decoder 122 are ANDed by the AND gates 118, 119, 120 and 121 with the write-enable signal on line 123 to produce the above-noted write-strobe signals on lines 105–108. The address lines 124 comprise six address bits (addr[5:0]). Two of the address lines (125, 126) connect the upper address bits (addr[4] and addr[5]) to the decoder 122, whereas four lines (bus 127) connect the lower address bits (addr[3:0]) directly to the RAM logic block (PFU1, PFU2, PFU3 and PFU4). These upper address bits (addr[4] and addr[5]), being those that are not connected directly to the address input lines (127) of the RAM logic block, must be decoded to provide the read-port enable signals that determine which PFU in the RAM logic block to enable at a given time.

It can be seen that the number of address lines that connect directly to a given PFU is dependent on the number of RAM bits in each PFU. In the example shown in FIG. 1, four address lines (addr [3:0]) are required to decode sixteen RAM bits, since $2^4=16$. It can also be seen that the prior-art FPGA requires separate decoding for the write-strobe and read-port enable signals when the size of the RAM to be implemented is larger than the size supported by each PFU. It can also be seen that in the illustrative 64×4 RAM (64 address bits and 4 data lines) of FIG. 1, a total of four AND gates (118, 119, 120, 121) and nine control signal lines (i.e., the write-enable 123, four write-strobes 105, 106, 107 and 108, and four read-port enables 113, 114, 115 and 116 are required, in addition to the other circuitry illustrated. Furthermore, the AND gates are implemented in another PFU that is additional to the ones shown in FIG. 1.

SUMMARY OF THE INVENTION

We have invented a field programmable gate array that includes programmable function units that have a write-port enable input when the PFUs are being used as user RAM units. In addition, the PFUs include a write-strobe input. The write operation is accomplished when both the write-port enable input and the write-strobe input are active.

DETAILED DESCRIPTION

Figure 1:
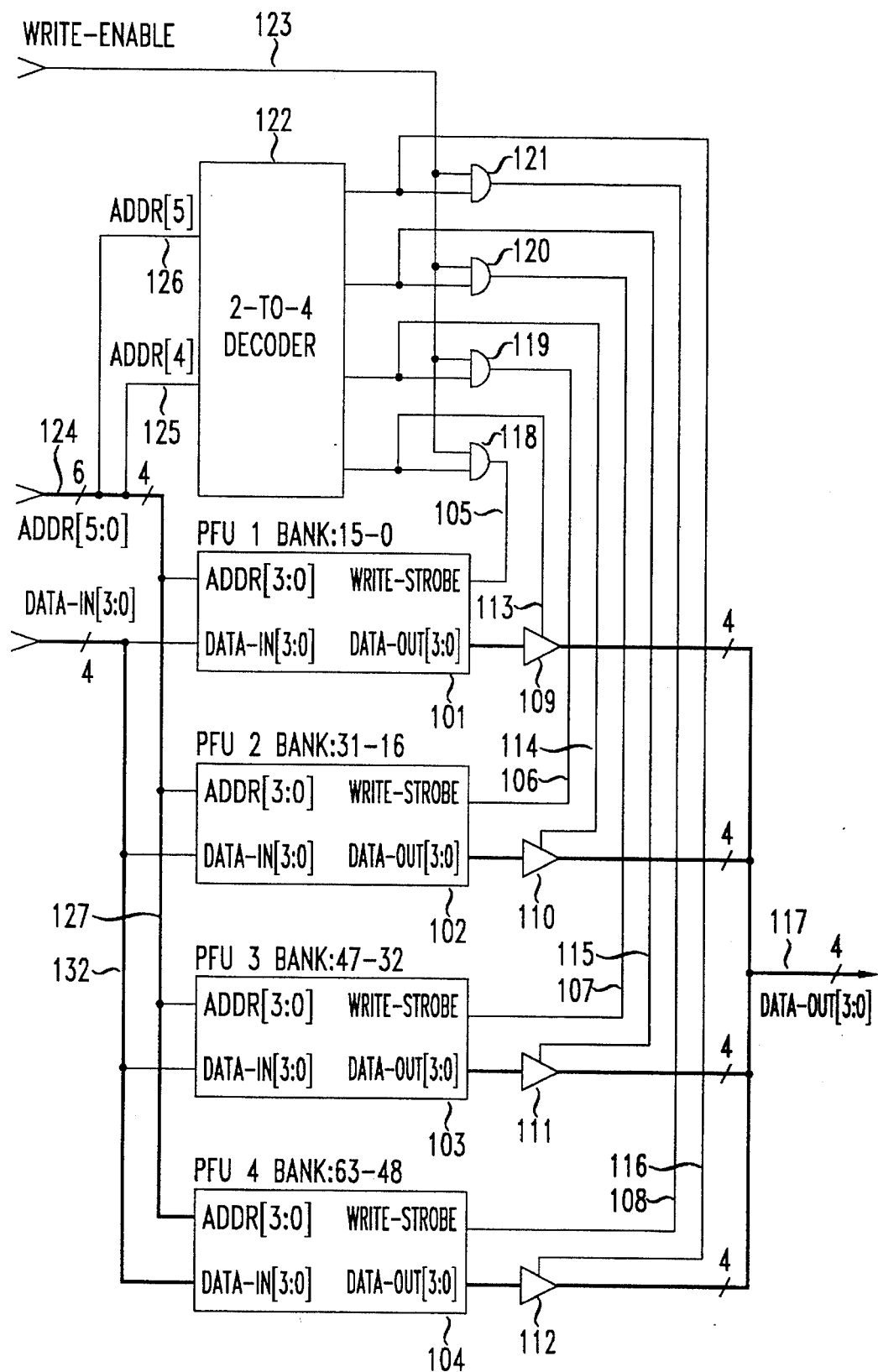
FIG. 1 illustrates a prior-art technique for implementing a field programmable gate array random access memory.
Figure 2:
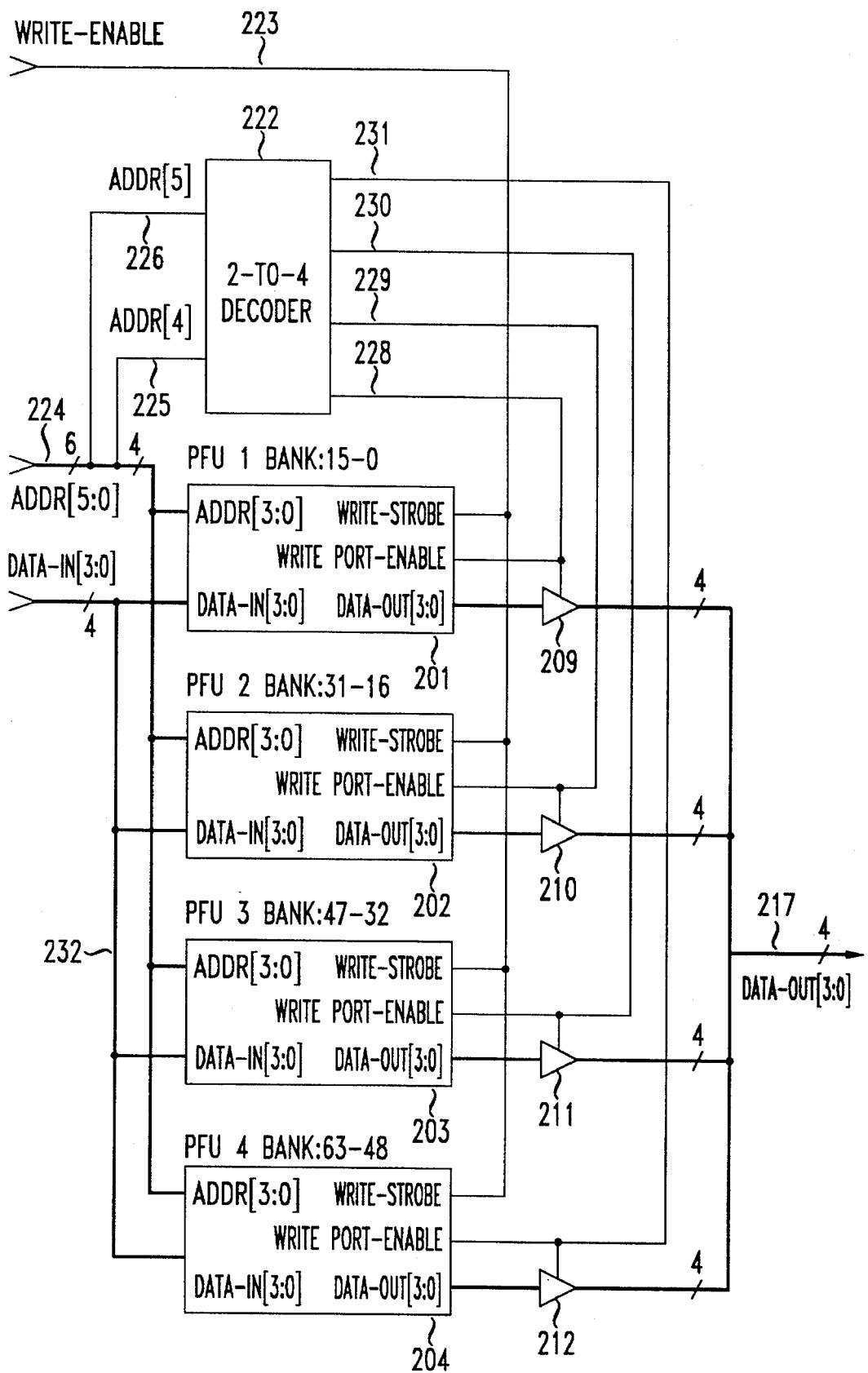
FIG. 2 illustrates an embodiment of the inventive technique for implementing a field programmable gate array random access memory.

The following detailed description relates to an integrated circuit field programmable gate array having memory cells that may be user-configurable to function as either a look-up table for implementation of logic functions, or alternatively as a random access memory. Referring to FIG. 2, a 64×4 RAM that embodies the inventive technique is shown as an illustrative example. Each PFU (201, 202, 203 and 204) includes a write-port enable input, in addition to the write-strobe input noted above in regard to FIG. 1. The write-port enable input allows the writing of data into the RAM from lines 232 to be controlled by two signals: the write-enable (line 223), and the write-port enable (lines 228, 229, 230 and 231). The decoding for the write-port enable signal is the same as that for the read-port enable (tri-state signal T). Whereas the write-enable signal instructs the RAM regarding the read/write operation, the write-port enable signal selects which bank (i.e., PFU) to write to. This technique allows the removal of the four AND gates (118, 119, 120 and 121) shown in FIG. 1, and requires only five control signals to be routed; i.e., the write-enable and four address decodes used for both the write-port enable and the read-port enable. In a typical FPGA design, this allows for the reduction in the number of PFUs, since they typically implemented the AND gate functions. Requiring fewer PFUs and requiring fewer signals to route for a given application are significant advantages. In many cases, these advantages allow for higher system operating frequencies and more gate capacity for a lower cost.

Note that in FIG. 2, the write-port enable and the read-port enable signals are generated by the same decoder (222). Depending upon the input address, the signals generated by this decoder select the appropriate RAM bank (i.e., the appropriate PFU). The primary write-enable signal is connected to the write-strobe input of all the PFUs in the RAM. Thus, this signal instructs all the RAM banks whether or not a write to the RAM is to occur. The write-strobe input and the write-port enable input are then ANDed together internally in each PFU. If a RAM bank is not being enabled by the write-port enable signal when the write-strobe signal occurs, then the write-strobe signal is blocked and a write does not take place. Only the RAM bank that has the write-port enable input activated by the decoded signal would be activated by the signal on the write-strobe input. Thus, the effective RAM operation is comparable to that of FIG. 1 insofar as the user of the FPGA is concerned.

However, the inventive technique illustrated in FIG. 2 provides the following advantages: (1) The extra PFU(s) for implementing four AND gates is no longer required, which allows for an increase in the effective gate capacity of the FPGA; and (2) there is no extra level of delay between the primary write-enable signal input and the write-strobe inputs of the RAM banks, which increases the effective speed of the FPGA. These advantages are related to the fact that the FPGA that implemented the AND function in prior-art designs was typically 10 to 100 times larger than the AND gates implemented as dedicated (i.e., non-programmable) logic elements as used herein. This allows for a significant size reduction using the present invention. Furthermore, the LUTs used in the FPGAs in the prior-art AND gate implementation were also much slower than the dedicated AND gates used herein.

The above description has been given in terms of an asynchronous RAM. However, synchronous RAMS are also known in the art for use with FPGAs, wherein an additional clock input is provided to synchronize the write-strobe signal. The present invention may be used with this type of RAM in the same manner as described above, by allowing the write-port enable signal to be synchronized by the clock as well as the write-strobe signal. Note that the write-port enable input may be used for other functions when the PFU is not in the RAM mode, as typically determined by user programming. Similarly, the write-strobe input may be used for other functions when the PFU is not in the RAM mode.

We claim:

1. An integrated circuit comprising a field programmable gate array comprising an array of programmable function units that each comprise an array of memory cells that can be user-configured as either a look-up table for performing logic functions, or alternatively as a random access memory, Characterized in that said programmable function units each comprise a write-strobe input and a write-port enable input, wherein data may be written into said random access memory when both said write-strobe input and said write-port enable input are active.

2. The invention of claim 1 further comprising tri-state output buffers having their inputs connected to the random access memory data outputs of associated programmable function units, and each of said output buffers having a control input connected to the write-port enable input of the associated programmable function unit.

3. The invention of claim 1 further comprising an address decoder having inputs connected to higher-order address lines and having decoded outputs connected to said write-port enable inputs of said programmable function units.

4. The invention of claim 1 further comprising a clock input, wherein both the write-strobe input and the write-port enable input must be active during a clock edge in order to write data into the random access memory.

5. The invention of claim 1 wherein either the write-strobe input or the write-port enable input may be used for functions other than controlling the writing of data into said programmable function unit when said programmable function unit is not used as a random access memory.

6. An integrated circuit comprising a field programmable gate array comprising an array of programmable function units that each comprise an array of memory cells that can be user-configured as either a look-up table for performing logic functions, or alternatively as a random access memory, Characterized in that said programmable function units each comprise a write-strobe input and a write-port enable input, wherein data may be written into said random access memory when both said write-strobe input and said write-port enable input are active, and further comprising tri-state output buffers having their inputs connected to the random access memory data outputs of associated programmable function units, and each of said output buffers having a control input connected to the write-port enable input of the associated programmable function unit, and further comprising an address decoder having inputs connected to higher-order address lines and having decoded outputs connected to said write-port enable inputs of said programmable function units.

7. A method of programming an integrated circuit comprising a field programmable gate array comprising an array of programmable function units that each comprise an array of memory cells that can be user-configured as either a look-up table for performing logic functions, or alternatively as a random access memory, Characterized by supplying to said programmable function units a write-strobe signal and a write-port enable signal, wherein data may be written into said random access memory when both said write-strobe signal and said write-port enable signal are provided.

8. The invention of claim 7 further comprising providing tri-state output buffers having their inputs connected to the random access memory data outputs of associated programmable function units, and each of said output buffers having a control input connected to the write-port enable input of the associated programmable function unit.

9. The invention of claim 7 further comprising providing an address decoder having inputs connected to higher-order address lines and having decoded outputs connected to said write-port enable inputs of said programmable function units.

10. The invention of claim 7 further comprising providing a clock signal, whereby data is written into the random access memory when both the write-strobe signal and the write-port enable signal are provided during a clock edge.

11. The invention of claim 7 further comprising using either the write-strobe signal or the write-port enable signal for functions other than controlling the writing of data into said programmable function unit when said programmable function unit is not used as a random access memory.

* * * * *